(12) United States Patent
Klug

(10) Patent No.: US 6,446,700 B1
(45) Date of Patent: Sep. 10, 2002

(54) FLOATING INSULATING BAFFLE FOR HIGH GRADIENT CASTING

(75) Inventor: Frederic Joseph Klug, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/356,868

(22) Filed: Jul. 19, 1999

(51) Int. Cl.⁷ .................... B22D 7/10; B22D 27/04; B22D 27/00; B22D 25/00
(52) U.S. Cl. .................. 164/126; 128/122.1; 128/122.2
(58) Field of Search ............ 164/122.1, 122.2, 164/126, 128; 264/632

(56) References Cited

U.S. PATENT DOCUMENTS

| | | | |
|---|---|---|---|
| 3,763,926 A | * 10/1973 | Tschinkel et al. | 164/126 |
| 4,106,905 A | * 8/1978 | Schmitt et al. | 422/42 |
| 4,108,236 A | 8/1978 | Salkeld | |
| 4,430,121 A | * 2/1984 | Shima | 75/303 |
| 4,546,048 A | * 10/1985 | Guenther | 123/193.6 |
| 5,404,721 A | * 4/1995 | Hartsock | 60/300 |
| 5,725,827 A | * 3/1998 | Rhodes et al. | 264/614 |
| 6,035,924 A | * 3/2000 | Graham | 164/122.2 |
| 6,085,827 A | * 7/2000 | Hugo | 164/348 |

FOREIGN PATENT DOCUMENTS

| | | |
|---|---|---|
| EP | 00631832 | 2/1993 |
| RU | 1401715 | 3/1986 |
| WO | WO-96/05006 A1 * | 2/1996 |

* cited by examiner

*Primary Examiner*—M. Alexandra Elve
*Assistant Examiner*—Kevin McHenry
(74) *Attorney, Agent, or Firm*—Robert P. Santandrea; Noreen C. Johnson

(57) ABSTRACT

A method for shielding a molten metal cooling bath used in directional casting of superalloys from a high temperature furnace environment. A plurality of floating ceramic baffles are used, floated on the top of such cooling bath so as to substantially cover the surface thereof. Each baffle member comprises a hollow ceramic member and ceramic seal means sintered to such hollow member so as to form a hermetically sealed chamber within the hollow member. The baffles are displaced during the directional casting process when a mold containing the cast article is lowered into the cooling bath. A ceramic baffle of this construction is also disclosed.

15 Claims, 5 Drawing Sheets

FLOATING INSULATING BAFFLE FOR HIGH GRADIENT CASTING

BACKGROUND OF THE INVENTION

This invention relates generally to high temperature gradient casting apparatus utilising a molten metal crystallizer and more particularly to floating heat insulating baffles for shielding the cooling bath from high temperature radiating from such casting furnace, and to a method of directional casting of articles using such ceramic baffles.

The casting of single crystal and directionally solidified superalloys requires the cooling of the superalloy in a temperature gradient. Typically, the temperature gradient is achieved by melting the superalloy in a high temperature furnace and then slowly withdrawing the superalloy from the furnace and lowering it into a liquid metal cooling bath, commonly referred to a crystallizer bath, which causes corresponding gradual solidification of the cast article. The best superalloy mechanical properties are achieved when the highest temperature gradients are used. Common metals for use as a crystallizer bath include tin and aluminium.

A typical apparatus for casting directionally solidified metals is illustrated in U.S. Pat. No. 4,108,236 (Salkeld). Salkeld shows an apparatus having a high temperature furnace suspended over a molten metal bath. Beneath the heating chamber is a floating insulating baffle. Openings through the bottom of the furnace enable a mold to be lowered therethrough.

Materials used for floating baffles must be chemically stable with respect to the liquid crystallizer, have low thermal conductivity, and a density low enough (and a displaced volume high enough) to allow the material to float on the liquid crystallizer. The most stable ceramic materials with respect to liquid aluminum crystallizers are alumina (aluminum oxide) and zirconia (zirconium oxide). Different methods of lowering the density of alumina, zirconia or other chemically compatible materials have been used. For example, the desired material has been formed into integral hollow ceramic bubbles. Unfortunately, the method of manufacturing substantially spherical, hollow ceramic bubbles produces a very thin wall that is easily broken. This makes the substantially spherical bubbles unsuitable as a floating baffle material because whenever a bubble is broken, the ceramic will sink to the bottom of the crystallizer vessel. Bubbles with a thicker, stronger wall are not currently available and a manufacturing technique to make a thicker, stronger wall on the bubbles is not known.

The Salkeld reference discussed above teaches a discshaped, heat insulating baffle constructed of a fibrous zirconia insulating core bonded in a sandwich-type arrangement between heat resistant graphite sheets as being suitable for applications in molten tin at 500° F. (250° C.).

Published EPO 0631832A1 illustrates a floating thermal insulating layer 13 which floats on a cooling bath used in a directional solidification casting process (see FIG. 4 thereof). It is disclosed that the thermal layer "consists of a material capable of flowing" and that the mold when lowered into the cooling bath "penetrates" the thermal layer. The material of the insulating layer is disclosed to be prepared from granules of graphite, ceramic, or aluminum oxide with a coating that prevents wetting, such as boron nitrate. Alternately, solids of boron nitrate or spherules of $SiAlO_2N$ are disclosed as being capable of being used. Undesirably, however, as mentioned above, where aluminum is used as the molten metal cooling bath, dense solids (including boron nitrate) will typically be too dense to float on such cooling bath. In addition, integral hollow spherules of $SiAlO_2N$, are generally unsuitable since the method of manufacture produces, as mentioned above, a thin wall that is easily broken or cracked with a resultant of loss of insulating capability.

Each of the above references provides that the insulating baffle disclosed in such references possess an opening for lowering the mold into the cooling bath. This configuration has the drawback that there exists an uninsulated portion of the cooling bath through which conduction of heat can readily occur.

Likewise, Russian patent No. 1401715 teaches a floating thermal baffle 5 for a cooling bath used in a directional casting furnace. Such baffle 5 is constructed of alternating layers of heat resistant material 6 (graphite). Again, due to the provision of an opening in such baffle 5 to allow for the lowering of the cast metal and mold into the cooling bath, such thermal layer and casting method suffers from the same disadvantages of Salkeld and EPO 0631832A1, namely an opening in the floating thermal baffle which results in undesirable convection of heat, thus undesirably reducing the thermal gradient between the cooling bath and the mold being lowered into such bath.

SUMMARY OF THE INVENTION

In order to overcome the aforesaid disadvantages of the prior art, the present invention in one broad aspect thereof provides a method for providing a floating thermal insulating layer over a liquid metal cooling bath used in a directional casting furnace, which avoids having to provide an opening in the thermal layer. A plurality of hollow ceramic baffles are provided, which float in the surface of the crystallizer cooling bath. Such plurality of baffle members provide an insulating layer and advantageously are displaced only to the extent caused by the lowering of the mold into the crystallizer during the directional solidification process. Due to their floating and displaceable characteristics, the individual baffle members surround and conform to the exterior periphery of the mold when it is lowered into the crystallizer bath, advantageously maintaining the thermal insulating layer as close to the mold as possible.

Moreover, upon removal of the mold and cast article from the cooling bath, the floating baffles, due to their displaceable nature, then float to their original position substantially re-covering all of the surface of the cooling bath.

In order to ensure floatation of such baffles in cooling mediums such as molten aluminum, the ceramic members of the present invention are each constructed in a particular manner to create a hollow hermetically sealed chamber therein. Accordingly, in one of the broadest aspects of the present invention, a method of providing an insulative heat barrier over a surface of a cooling bath during directional casting of superalloys is provided, comprising the steps of substantially covering said surface with a plurality of ceramic baffle members, such ceramic baffle members each comprising a hollow ceramic member and ceramic seal means sintered to said hollow member so as to form a hermetically sealed chamber within said hollow member, such baffle members floatable on the surface of the cooling bath and substantially non-reactive with the cooling bath.

The ceramic baffle members are each assembled from the hollow ceramic member and seal means when each are in a green (unsintered) state, and subsequently both sintered to each other to form the sealed chamber. It is provided, in a preferred embodiment, that the ceramic seal means be situate within the hollow member and adapted to shrink less than the hollow member during the sintering process, so that the hollow member is "shrink-fit" around the seal means so as to assist in the seal means hermetically sealing the chamber of the baffle member.

It is preferred that the ceramic baffle member be formed as an extruded ceramic tube (of any shape such as cylindrical, rectangular, square, or triangular), and having a pair of respectively opposite distal ends, and that the seal means comprise a pair of diepressed thin flat end members adapted for respective insertion in the distal ends of the ceramic tube member. When the end members are inserted in a green state into the opposite distal ends of the hollow ceramic member (also in a green state), and the assembly fired, the end members become sintered to the hollow member creating a hermetically sealed chamber sealed at both ends by the respective end members. Where the end members are of a ceramic material which shrinks less than the ceramic material of which the hollow members are comprised, this feature will assist the hollow member in being shrink fit around the periphery of the end members and assist the end members in creating a hermetic seal at the respective ends of the hollow tube member. In the preferred embodiment the ceramic tube member is substantially cylindrical, and the end members comprise thin, substantially flat circular disks.

The preferred cylindrical configuration for the baffle members possesses a number of advantages. Firstly, it is relatively easy to form an extruded ceramic tube member in a hollow cylindrical configuration, which may be cut in sections to form hollow members for a number of ceramic baffles. Secondly, where the density and enclosed volume of a cylindrical baffle member is such that a longitudinal axis of the cylindrical tube member lies parallel to, but above, the surface of the molten cooling bath, subsequent or unintended solidification of the cooling bath will not result in compression of the ceramic baffles within the metal bath and possible breakage of the baffle due to compressive forces exerted thereon during the cooling or heating the now-solidified metal. Instead, during any expansion of the molten metal arising from solidification or heating, due to the rounded nature of the cylindrical tube member, in the baffle member will be forced upward from the bath, and the bath will not be able to exert a compressive force on the baffle.

Advantageously, the creation of a hermetically sealed chamber within the ceramic baffle used in the method of the present invention increases the insulative properties of the baffle. Moreover, if the sintering step used during the forming of the ceramic baffles is carried out in a vacuum or partial vacuum, the vacuum so created in the sealed chamber of the baffle member will further increase the insulative properties of the ceramic baffle. The manner of construction of the ceramic baffles of the present invention is particularly suited to forming a vacuum within the sealed chamber.

Advantageously, the present invention further provides for ceramic baffles which may be constructed with relatively thick walls and having a hollow sealed chamber under a vacuum, the latter greatly adding to the insulative qualities of the baffle members. An opacifier may further be added to the ceramic material used for the hollow member and the seal means, as a means of reducing radiant heat loss through such baffles.

The hollow tube member and seal means may be comprised of similar or different ceramic material, and preferably of ceramics of different composition or at least of different thermal expansion, provided that each ceramic material is capable of being sintered to the other. In the preferred embodiment the hollow tube member and the seal means are comprised of ceramics of identical composition, but of different green densities, so that the assembly, when heat is applied during the sintering process, will, due to the different green densities and different rates of expansion/contraction, cause the tube member and the seal means to be press-fit together to thereby assist in creating a hermetic seal between such two components. Such hermetic seal allows the creation of a sealed inner chamber within the baffle member to thereby allow the insulative properties of the baffle member and further ensure buoyancy of the ceramic member within most liquid metal baths. As previously mentioned, to assist the seal means, typically flat disks, in plugging the distal ends of the hollow tube member, it is desired that the end disks be adapted be adapted, due to having a different green density or different co-efficient of thermal expansion, to shrink less than the hollow member which they are inserted within. Such accordingly permits the hollow member to be "shrink fit" about the periphery of the sealing disks, thus better ensuring a hermetic seal is created by the end members and a sealed chamber is created within the baffle member. This ensures no molten metal will be permitted to leak into the sealed chamber, thus advantageously maintaining the insulative properties of the baffle member. Typical satisfactory ceramic materials for the hollow member and the seal means include alumina (aluminum oxide), silicon carbide, silicon dioxide, mullite, and zirconia (zirconium oxide), although other ceramics and ceramics/compounds may be selected and the invention is not limited to the aforesaid ceramics and ceramics/compounds.

In a further broad aspect of the present invention, a method of producing single crystal and directionally solidified superalloys is provided, in which:

a) said superalloy is melted in a high temperature furnace;

b) said molten superalloy is transferred into a ceramic mold; and c) said ceramic mold and contained molten superalloy are lowered into a molten metal cooling bath, comprising the steps of:
  i) floating a plurality of ceramic baffle members on a surface of said cooling bath to substantially cover said surface to form an insulating layer for reducing heat transfer from said furnace into said cooling bath via said surface, said ceramic baffles being substantially non-reactive with said molten metal cooling bath; and
  ii) lowering said mold through said insulating layer of ceramic baffle members into said cooling bath.

In another particular aspect of the present invention, a ceramic baffle is provided, adapted for floating on a surface of a cooling bath, for use in a directional casting furnace, a plurality of which adapted to form a floating insulative heat barrier over the surface of said cooling bath, comprising:

a hollow ceramic member;

ceramic seal means sintered to said hollow member so as to form a hermetically sealed chamber within said hollow member.

DESCRIPTION OF THE DRAWINGS

Preferred embodiments of the invention are described below with reference to the accompanying drawings in which.

DESCRIPTION OF PREFERRED EMBODIMENTS

Figure 1:
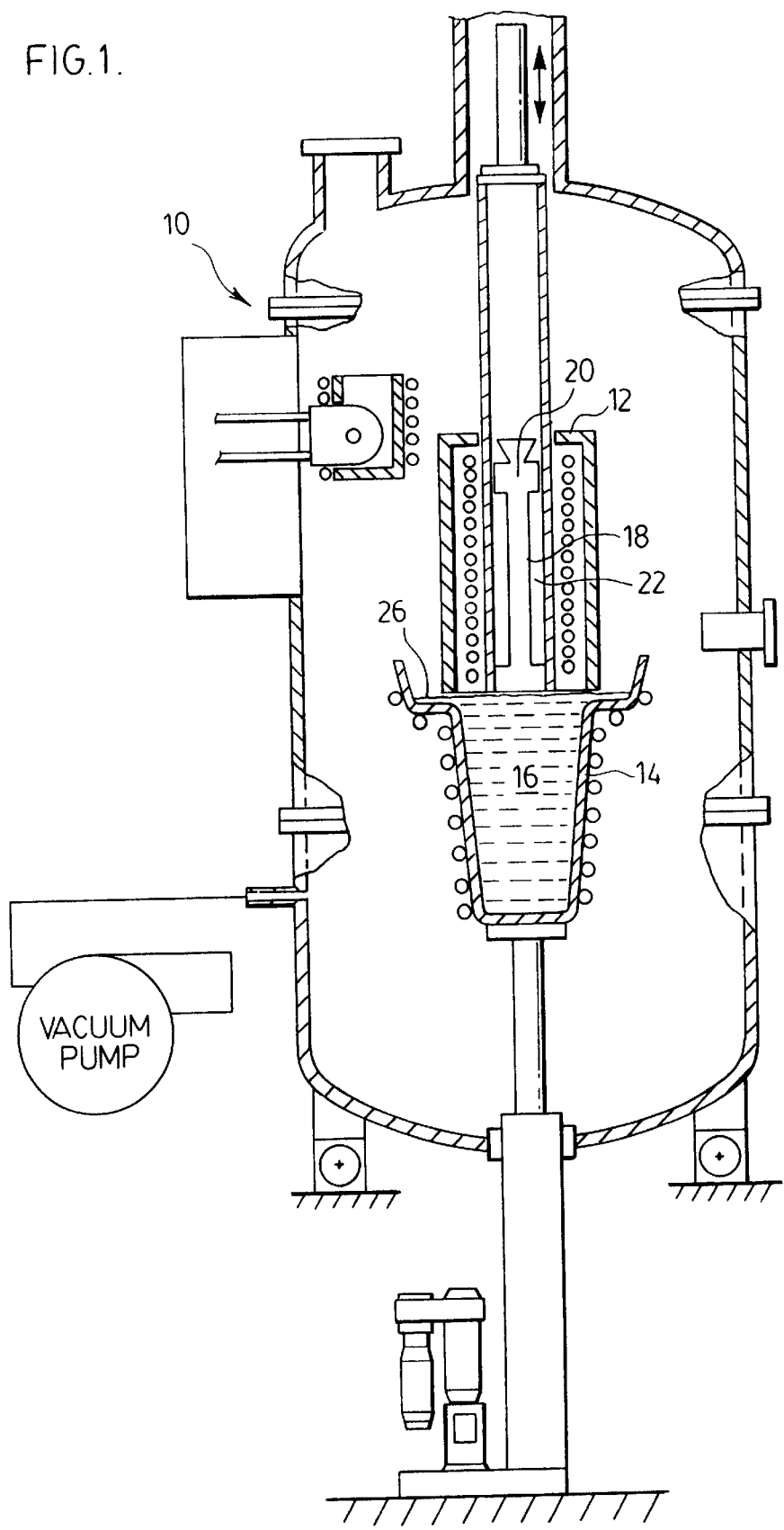
FIG. 1 is a cross-section through a directional casting furnace.

An apparatus for directionally solidifying a molten metal casting to produce a single crystal or directionally solidified superalloy is generally indicated by reference 10 in FIG. 1. The apparatus includes a high temperature furnace 10, including a heating chamber 12, suspended over a coolant bath 14 containing a molten metal 16 typically of molten tin or aluminium.

A ceramic mold 18 is shown within the heating chamber 12 wherein a liquefied molten metal 20 has been poured into preheated mold 18. The ceramic mold 18 and molten metal 16 therein is typically thereafter lowered from within the heating chamber 12 into the molten metal 16 contained in the coolant bath 14 at a rate selected to produce a directionally solidified cast article.

In order to maintain as great a temperature differential as possible between an interior 22 of the heating chamber 12 and the coolant bath 14 and the molten metal 16 contained therein, the surface 26 of the coolant bath 14 should be shielded against heat radiated from within the heating chamber 12.

According to the present invention, a plurality of ceramic baffle members 24 (in FIGS. 2 through 9) are floated on a top surface 26 of the coolant bath 16 to form both a conductive and radiant heat shield. The ceramic baffle members 24 should of course be substantially non-reactive within the molten metal 16 in the coolant bath 14.

Figure 2:
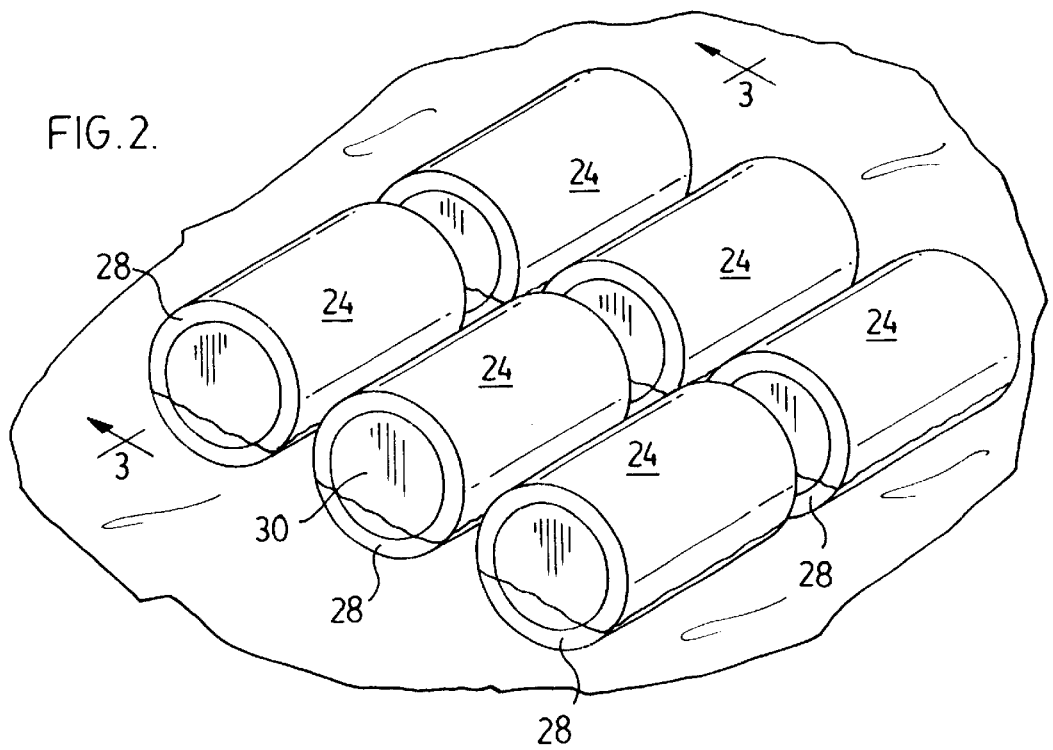
FIG. 2 is a perspective view of one embodiment of the floating baffles of the present invention placed on a molten metal bath according to the method of the present invention.
Figure 3:
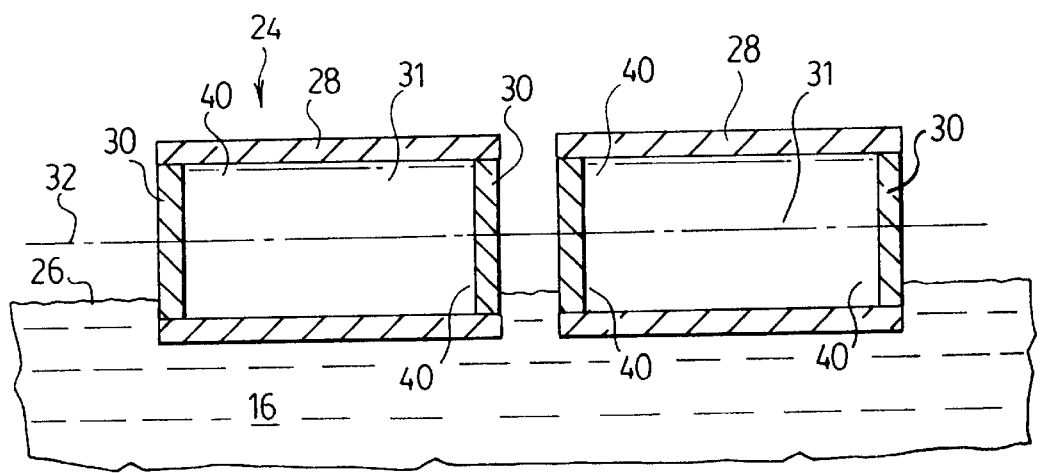
FIG. 3 is a section and view on plane 3—3 of FIG. 2.

A typical ceramic baffle member 24 of the present invention is illustrated in more detail in FIGS. 2 and 3. The ceramic member 24 in this particular preferred embodiment is made up of a hollow ceramic member in the form of a cylindrical tube 28 having a substantially disc-shaped ceramic end member 30 inserted into each of the opposite distal ends 40 thereof. The tube 28 may be extruded and the end members 30 die pressed. The ceramic baffle member 24 is typically assembled from a tube 28 and two end members 30 inserted therein in a green (unfired) state. Upon firing the tube 28, the end members 30 will sinter and shrink somewhat. Preferably the tube 28 should shrink in diameter more than the end members 30 as this, in combination with the sintering, will form a hermetically sealed joint between the tube 28 and the end members 30, and also form a sealed chamber 31 within tube 28.

The baffle members 24 should preferably be sintered in a low pressure atmosphere to leave at least a partial vacuum inside chamber 31. This created vacuum both reduces the thermal conductivity of the baffle member 24 and also avoids unwanted pressurization upon the ceramic baffle members 24 being heated by the molten metal 16. Excessive pressure in the ceramic member 24 could cause it to burst.

Each ceramic member 24, when of a cylindrical configuration and formed from a tube 28, has a longitudinal axis 32 generally coaxial with the tube 28. Preferably the dimensions of the ceramic member 24 should be selected to cause it to float with its the longitudinal axis 32 above, but parallel to, the surface 26 of the molten metal 16 containing 4 the coolant bath 14, as illustrated in FIG. 3. This shape will cause any compressive stresses arising from solidification or melting of the metal 16 to force the cylindrical ceramic baffle members 24 upward rather than to crush them. It is not a necessity, however, of this invention that the ceramic member 24 be adapted to have its longitudinal axis lie above the surface of the coolant bath 14, and in another, but less preferred embodiment of the present invention the ceramic baffle 24 of the present invention is adapted to have its longitudinal axis 32 merely proximate to, but not necessarily above, the surface of the molten bath, wherein the ceramic baffle member is merely buoyant within the coolant bath 14.

A typical cylindrical baffle member 24 suitable for use with a molten aluminum metal 16 contained in the coolant bath 14 may be made from aluminum oxide ("alumina") having an outside diameter of ½ inch (1.27 cm), a length of 2 inches (5.08 cm), and an all thickness of 0.030 inches (0.0076 cm).

To further reduce radiant heat transfer, the ceramic members 24 may be rendered opaque using a suitable opacifier either in the alumina or as a coating over the inside or outside surfaces. Alternatively the baffle members may be made of increased porosity which tends to reduce transparency.

Figure 4:
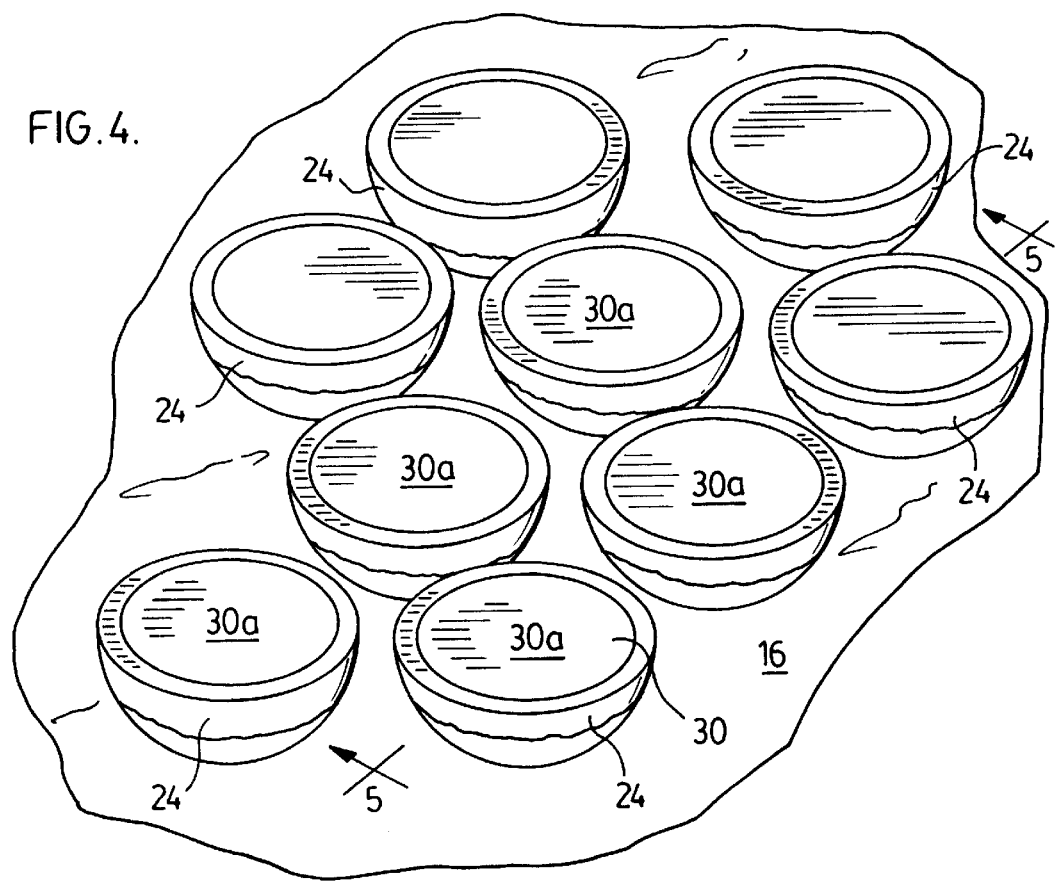
FIG. 4 is a perspective view of another embodiment of the floating baffles of the present invention, placed on a molten metal bath according to the method of the present invention.
Figure 5:
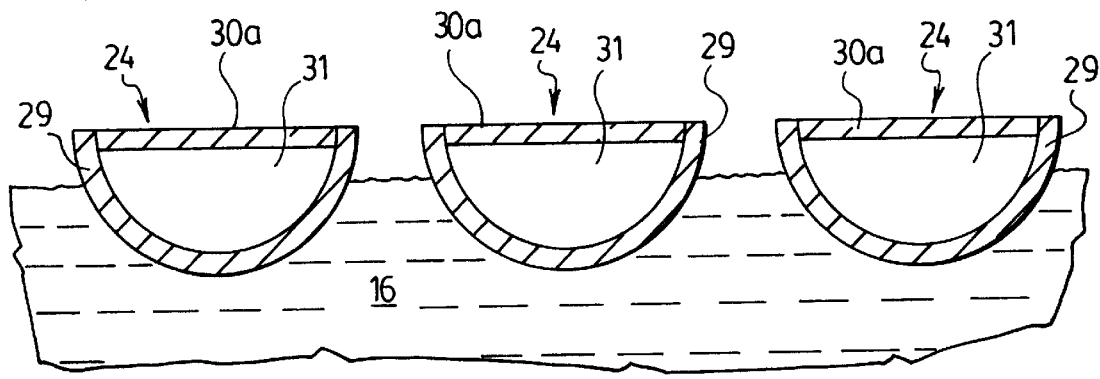
FIG. 5 is a sectional view along plane 4—4 of FIG. 4.

FIGS. 4 and 5 show an alternative embodiment of the ceramic baffle member 24 of the present invention. In this embodiment the ceramic hollow member is in the form of a hemispherical shell 29, which at its open end has seal means in the form of a single thin, flat circular disk 30a of diameter slightly less than that of shell 29 so as to be capable of being placed therewithin and sintered thereto to form a hermetically-sealed interior chamber 31 within such baffle member 24.

Advantageously, like the cylindrical baffle members 24 shown in FIGS. 2 and 3, the hemispherical shell 29 which rests in the molten metal 16 is rounded. This configuration prevents any compressive stresses in the molten metal 16 from crushing the baffle member 24, and instead such rounded surface of hemispherical shell 29 will be forced upwards by any such stresses, thereby avoiding being crushed by such stresses.

Figure 6:
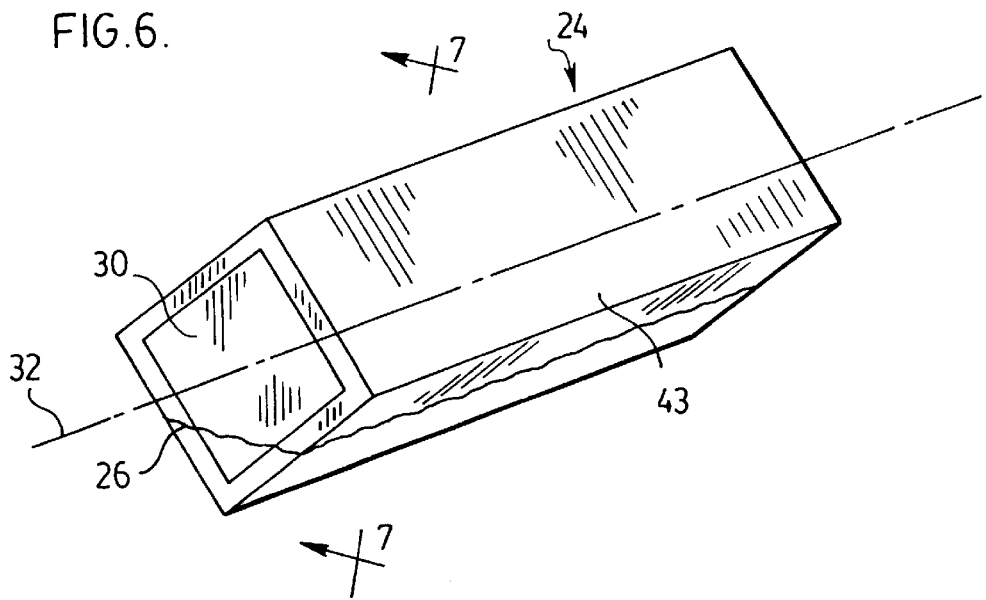
FIG. 6 is a perspective view of another embodiment of the ceramic baffle of the present invention.
Figure 7:
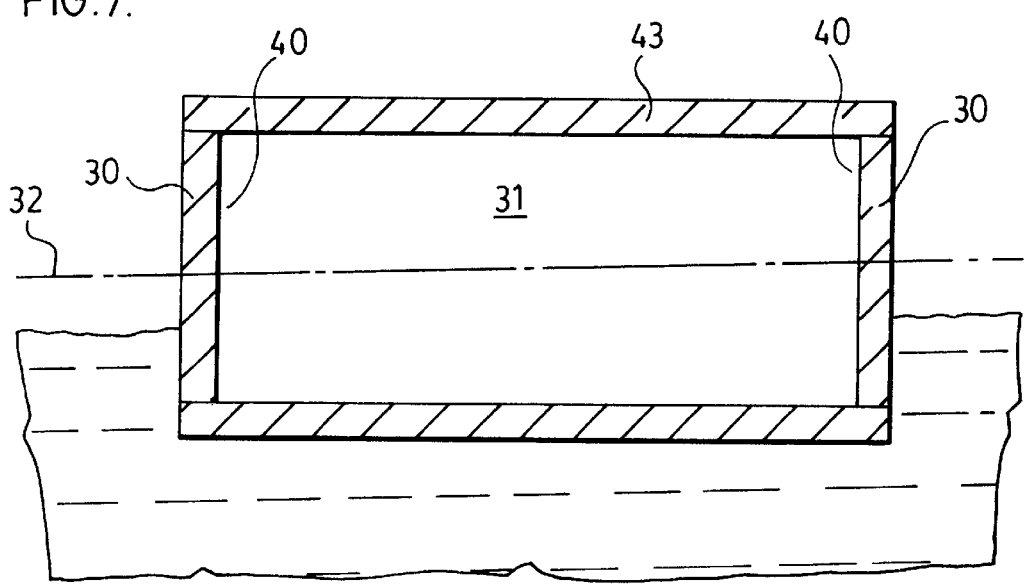
FIG. 7 is a sectional view along plane 5—5 of FIG. 6.

FIGS. 6 and 7 show yet another alternative embodiment of the ceramic baffle member 24 of the present invention. In this embodiment the ceramic hollow member is in the form of an extruded rectangular, hollow tube member 43, having at its two opposite distal ends 40 thin, flat end members 30 placed therewithin and sintered thereto, so as to form a hermetically-sealed interior chamber 31 within such baffle member 24.

Again, it is preferred that the density and enclosed volume of the baffle member 24 shown in FIGS. 6 and 7 is such that longitudinal axis 32 of the tube member 43 lies parallel to, but above, the surface 26 of the molten metal 16 when the baffle member 24 is floated thereon. More particularly, the length of the baffle member 24 exceeds its the width by an amount sufficient to cause the baffle member to float lengthwise on the surface 26 of the molten metal 16, with the longitudinal axis 32 above surface 26 of the molten metal 16. This ensures that only an upwardly angled surface of tube member 43 will contact molten metal 16, and in the event of any compressive stresses exerted on tube member 43, such tube member 43 will be able to move upward in the molten metal 16 so as to automatically relieve such compressive stresses and prevent the baffle member 24 from being crushed due to such compressive stresses.

In all of the embodiments shown in FIGS. 2–7, the individual baffle members 24 are freely displaceable and submergible within the molten metal 16, and may be displaced or submerged within the bath 14 by the lowering of mold 18 (see FIGS. 8 and 9) therewithin.

Figure 8:
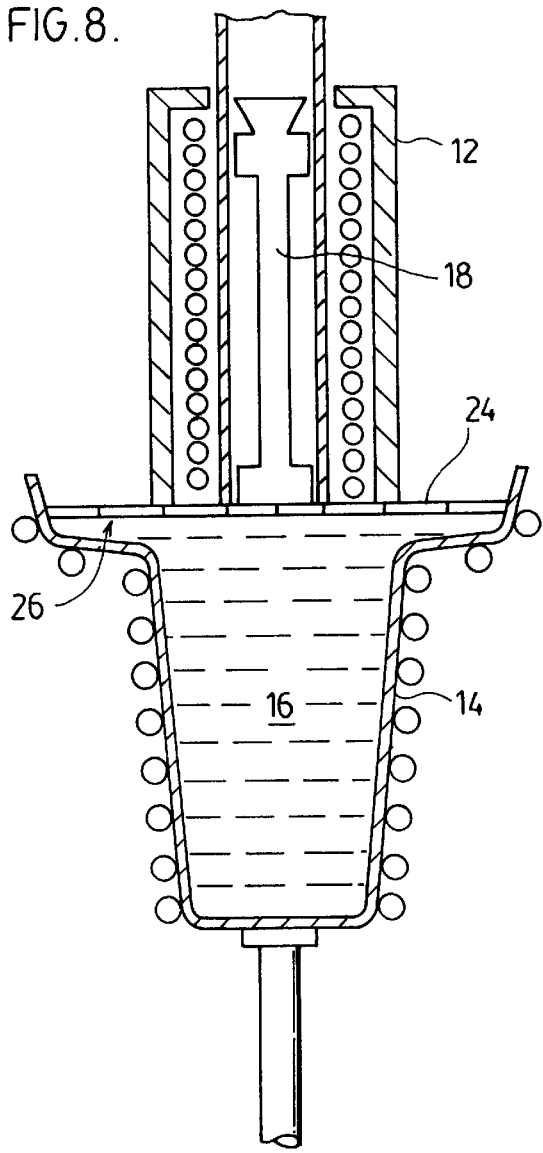
FIG. 8 is a cross-section through a high temperature furnace and molten metal crystallizer bath showing a layer of floating baffles according to the present invention on a surface of the cooling bath prior to lowering of a ceramic mold therethrough.
Figure 9:
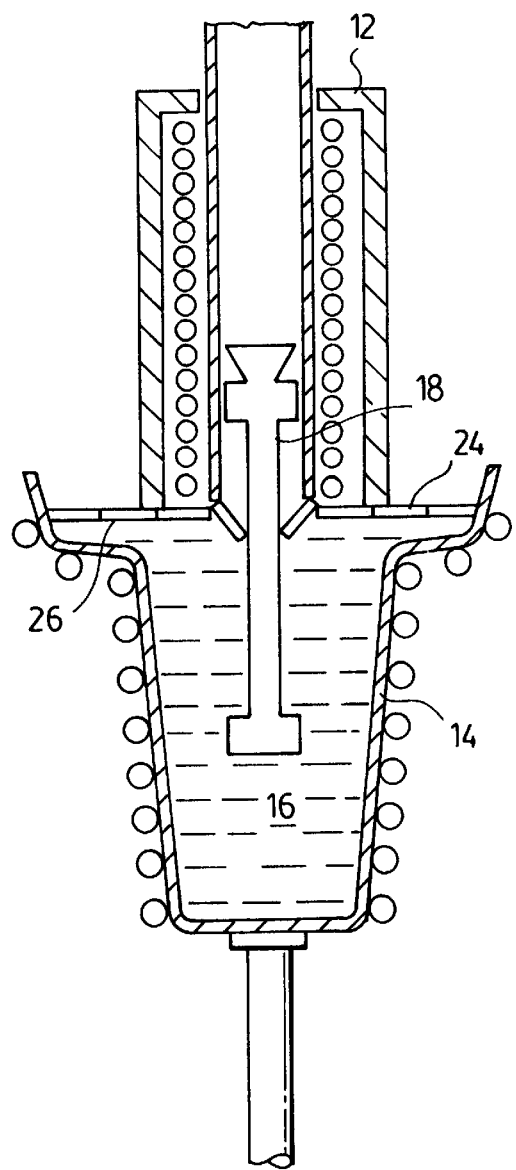
FIG. 9 is a cross-section corresponding to FIG. 4 but illustrating the floating baffle arrangement during lowering of the ceramic mold into the molten metal crystallizer bath.

FIGS. 8 and 9 illustrate how a ceramic mold 18 may be lowered through a layer of ceramic cylinders 24. As shown in FIG. 9, the ceramic baffle members 24 will be displaced by the ceramic mold 18 when the mold 18 is lowered into the bath 14.

The above embodiments are intended in an illustrative rather than a restrictive sense. Variations may be apparent to persons skilled in ceramic structures without departing from the spirit and scope of the invention as defined by the claims set out below.

What is claimed is:

1. A method of providing an insulative heat barrier over a surface of a molten metal contained in a cooling bath during directional casting of superalloys, comprising the steps of:
    i) substantially covering said surface with a plurality of ceramic baffle members, said ceramic baffle members each comprising a hollow ceramic member and ceramic seal means sintered to said hollow member so as to form a hermetically sealed chamber within said hollow member, said baffle members floatable on said surface within said cooling bath and substantially non-reactive with said molten metal, and
    ii) said hollow ceramic member comprising an extruded ceramic tube member having a pair of respectively opposed opposite distal ends, said seal means comprising a pair of die-pressed, thin flat end members adapted for respective insertion in said distal ends of said ceramic tube member.

2. The method as claimed in claim 1, said ceramic baffle members each assembled from said hollow ceramic member and said seal means when each in a green state and subsequently sintered to each other to form said sealed chamber, said ceramic seal means situate within said hollow member and adapted to shrink less than said hollow ceramic member during said sintering so as to assist said ceramic seal means in hermetically sealing said sealed chamber.

3. The method as claimed in claim 1, wherein said ceramic tube member is substantially cylindrical, and said end members comprise thin, substantially flat circular disks.

4. The method as claimed in claim 4, said ceramic baffle member having a density and enclosed volume such that a longitudinal axis of said cylindrical ceramic tube member lies parallel to, but above, said surface of said molten metal when said baffle member is floated thereon.

5. The method as claimed in claim 1, wherein said sealed chamber is under at least a partial vacuum.

6. The method as claimed in claim 1, wherein said ceramic hollow members and said ceramic seal means are each comprised of a ceramic selected from the group of ceramics comprising aluminum oxide, silicon carbide, silicon dioxide, mullite, and zirconium oxide.

7. The method as claimed in claim 1, wherein said ceramic hollow members and said ceramic seal means each contain an opacifier to render said ceramic baffle members substantially opaque.

8. A method of producing single crystal and directionally solidified superalloys, in which:
    a) said superalloy is melted in a high temperature furnace;
    b) said molten superalloy is transferred into a ceramic mold; and
    c) said ceramic mold and contained molten superalloy are lowered into a molten metal cooling bath, comprising the steps of:
        i) floating a plurality of ceramic baffle members on a surface of said molten metal bath to substantially cover said surface to form an insulating layer for reducing heat transfer from said furnace into said cooling bath via said surface, said ceramic baffles being substantially non-reactive with said molten metal;
        ii) lowering said mold through said insulating layer of ceramic baffle members into said molten metal; and
    d) said ceramic baffle member comprising an extruded ceramic tube member having a pair of respectively opposed opposite distal ends, further comprising seal means comprising a pair of die pressed, thin flat end members adapted for respective insertion in said distal ends of said ceramic tube member.

9. The method as claimed in claim 8, said ceramic baffle members each comprising a hollow ceramic member and ceramic seal means sintered to said hollow member so as to form a hermetically sealed chamber within said hollow member, said baffle members substantially floatable on said surface.

10. The method as claimed in claim 9, said ceramic baffle members each assembled from said hollow ceramic member and said seal means when each in a green state and subsequently sintered to each other to form said sealed chamber, said ceramic seal means situate within said hollow member and adapted to shrink less than said hollow ceramic member during said sintering so as to assist said ceramic seal means in hermetically sealing said sealed.

11. The method as claimed in claim 8, wherein said ceramic tube member is substantially cylindrical, and said end members comprise thin, substantially flat circular disks.

12. The method as claimed in claim 11, said ceramic baffle member having a density and enclosed volume such that when said baffle member is floated on said surface of said molten metal, a longitudinal axis of said cylindrical ceramic tube member lies parallel to, but above, said surface of said molten metal.

13. The method as claimed in claim 9 wherein said sealed chamber is under a partial vacuum.

14. The method as claimed in claim 9, wherein said ceramic hollow members and said ceramic seal means are each comprised of a ceramic selected from the group of ceramics comprising aluminum oxide, silicon carbide, silicon dioxide, mullite, and zirconium oxide.

15. The method as claimed in claim 9, wherein said ceramic hollow members and said ceramic seal means each contain an opacifier to render said ceramic baffle members substantially opaque.

* * * * *